(12) United States Patent
Budri et al.

(10) Patent No.: US 7,781,289 B1
(45) Date of Patent: Aug. 24, 2010

(54) METHOD FOR FABRICATING HIGHER QUALITY THICKER GATE OXIDE IN A NON-VOLATILE MEMORY CELL AND ASSOCIATED CIRCUITS

(75) Inventors: Thanas Budri, Portland, ME (US); Jiankang Bu, Windham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 435 days.

(21) Appl. No.: 11/799,921

(22) Filed: May 3, 2007

(51) Int. Cl.
*H01L 21/8234* (2006.01)
(52) U.S. Cl. .................. 438/275; 438/981; 438/527; 438/529
(58) Field of Classification Search .......... 438/257, 438/258, 275, 276, 305, 527, 981, 529
See application file for complete search history.

(56) References Cited

U.S. PATENT DOCUMENTS

| | | | |
|---|---|---|---|
| 5,591,681 A * | 1/1997 | Wristers et al. | 438/762 |
| 5,942,780 A * | 8/1999 | Barsan et al. | 257/321 |
| 6,399,448 B1 * | 6/2002 | Mukhopadhyay et al. | 438/275 |
| 6,900,097 B2 * | 5/2005 | Chen et al. | 438/257 |
| 2004/0256658 A1 * | 12/2004 | Park et al. | 257/315 |
| 2006/0252209 A1 * | 11/2006 | Mori | 438/264 |

OTHER PUBLICATIONS

Brian Doyle et al., "Simultaneous Growth of Different Thickness Gate Oxides in Silicon CMOS Processing," IEEE Electron Device Letters, vol. 16, No. 7, Jul. 1995, pp. 301-302.
"6,774 Fall 2006: Chapter 7: Dopant Diffusion and Profile Measurement," Fall, 2006, Handout 13, pp. 1-38.

* cited by examiner

*Primary Examiner*—Charles D Garber
*Assistant Examiner*—Bryan R Junge

(57) ABSTRACT

A non-volatile memory cell includes a program transistor and a control capacitor. A portion of a substrate associated with the program transistor is exposed to multiple implantations (such as DNW, HiNWell, HiPWell, and P-well implantations). Similarly, a portion of the substrate associated with the control capacitor is exposed to multiple implantations (such as DNW, HiNWell, HiPWell, P-well, and N-well implantations). These portions of the substrate may have faster oxidation rates than other portions of the substrate, allowing a thicker front-end gate oxide to be formed over these portions of the substrate. In addition, a rapid thermal process anneal can be performed, which may reduce defects in the front-end gate oxide and increase its quality without having much impact on the oxide over the other portions of the substrate.

20 Claims, 4 Drawing Sheets

METHOD FOR FABRICATING HIGHER QUALITY THICKER GATE OXIDE IN A NON-VOLATILE MEMORY CELL AND ASSOCIATED CIRCUITS

TECHNICAL FIELD

This disclosure is generally directed to integrated circuits and more specifically to a method for fabricating higher quality thicker gate oxide in a non-volatile memory (NVM) cell and associated circuits.

BACKGROUND

Conventional non-volatile memory (NVM) cells typically include a gate oxide formed over a substrate. The thickness and quality of the gate oxide can have tremendous influence on NVM retention (the ability of the NVM cell to retain data). In general, a thicker or higher quality gate oxide can lead to better NVM retention. However, with the size reduction of NVM cells in complementary metal oxide semiconductor (CMOS) processes, the gate oxide of the NVM cells has become thinner and thinner.

One approach to overcoming this problem involves using a dual gate oxide (DGO) process, where two layers of gate oxide are formed. For example, a 1.8V gate oxide may be deposited on top of a 3.3V gate oxide. However, not all manufacturing platforms can provide multiple gate oxide thicknesses. Also, in some circumstances, adding multiple oxide layers together still cannot provide adequate gate oxide thickness.

Another approach involves growing oxides having different thicknesses in a single oxidation step (where the NVM gate oxide is thicker). This often involves preparing a silicon surface with nitrogen implantation before an oxidation process. However, the gate oxide quality from this process is typically not good, which allows higher leakage current and degrades NVM retention. It also requires the use of an extra nitrogen implant process step.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 4, discussed below, and the various embodiments used to describe the principles of the present invention in this patent document are by way of illustration only and should not be construed in any way to limit the scope of the present invention. Those skilled in the art will understand that the principles of the present invention may be implemented in any type of suitably arranged device or system.

Figure 1:
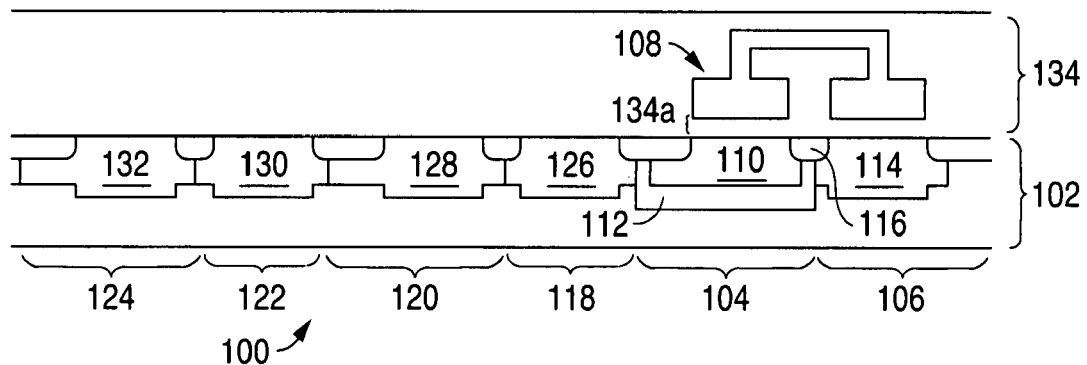
FIG. 1 illustrates an example memory cell according to one embodiment of this disclosure.

FIG. 1 illustrates an example memory cell 100 according to one embodiment of this disclosure. The embodiment of the memory cell 100 shown in FIG. 1 is for illustration only. Other embodiments of the memory cell 100 may be used without departing from the scope of this disclosure.

As shown in FIG. 1, the memory cell 100 is formed on a substrate 102. The substrate 102 represents any suitable substrate on which the memory cell 100 and other circuitry can be formed. For example, the substrate 102 could represent a silicon substrate. Any number of memory cells 100 and other circuitry could reside on the substrate 102. As a particular example, the substrate 102 could carry multiple memory cells 100 and other circuitry arranged to form a non-volatile memory (NVM), such as an electrically erasable programmable read-only memory (EEPROM).

In this example, the memory cell 100 includes a program transistor 104, a control capacitor 106, and a floating gate 108. The program transistor 104 may represent an n-channel metal oxide semiconductor (NMOS) transistor having a P-well 110 within a deep N-well 112 in the substrate 102. The control capacitor 106 may represent a p-channel metal oxide semiconductor (PMOS) transistor having an N-well 114. The program transistor 104 and the control capacitor 106 (as well as other elements in the memory cell 100) are separated by trenches 116 in the substrate 102.

An electrical charge representing a logical "one" or a logical "zero" can be written onto the floating gate 108, thereby programming a data value into the memory cell 100. The control capacitor 106 serves as the erase/control gate capacitor for the memory cell 100. The capacitance of the control capacitor 106 may be smaller than the gate capacitance of the program transistor 104.

During a programming procedure, a positive voltage can be applied to the gate and drain of the control capacitor 106, and a negative voltage can be applied to the P-well 110 and source grounding. Hot electrons from the program transistor 104 are injected into the floating gate 108, thereby programming a logical value into the floating gate 108. During an erase procedure, a high voltage can be applied to the gate of the control capacitor 106, and the other terminals can be grounded. Most of the erase voltage is coupled between the gate of the control capacitor 106 and the floating gate 108. Additional details regarding this type of memory cell are provided, for example, in U.S. patent application Ser. No. 11/389,984, which is hereby incorporated by reference.

In this example, the memory cell 100 also includes various other transistors 118-124. For example, the transistor 118 may represent a high-energy PMOS (HiPMOS) transistor having a high-energy N-well (HiNWell) 126, and the transistor 120 may represent a high-energy NMOS (HiNMOS) transistor having a high-energy P-well (HiPWell) 128. Also, the transistor 122 may represent a PMOS transistor having an N-well 130, and the transistor 124 may represent an NMOS transistor having a P-well 132. As described in more detail below, these transistors 126-132 may be formed during fabrication of the memory cell 100 to help facilitate the creation of a higher quality, thicker gate oxide over the program transistor 104 and the control capacitor 106.

As shown here, an oxide layer 134 is formed over the memory cell 100. The oxide layer 134 helps to encase and protect the memory cell 100. The oxide layer 134 could be formed using any suitable material(s), such as silicon dioxide. Also, the oxide layer 134 could be formed in any suitable manner. For example, a portion 134a of the oxide layer 134 could be formed through oxidation of part of the substrate 102. This portion 134a of the oxide layer 134 may sometimes be referred to as the "front-end gate oxide" of the memory cell 100.

As described in more detail below, the program transistor 104 and the control capacitor 106 are exposed to the implantations used to fabricate the transistors 118-124. This may help to facilitate the creation of a higher quality, thicker oxide over the memory cell 100, namely the front-end gate oxide 134a. More specifically, the transistor 118 may be formed using a HiNWell implantation, and the transistor 120 may be formed using a HiPWell implantation. Also, the transistor 122 may be formed using an N-well implantation, and the transistor 124 may be formed using a P-well implantation. In standard CMOS processes, all of these different implants are typically applied to different areas of a substrate, and they are not typically used to facilitate the creation of a front-end gate oxide of a memory cell.

In accordance with this disclosure, the program transistor 104 and the control capacitor 106 are exposed to multiple implantation processes. For example, the program transistor 104 may be exposed to a deep N-well (DNW) implantation, a HiNWell implantation, a HiPWell implantation, and a P-well implantation. Similarly, the control capacitor 106 may be exposed to a deep N-well implantation, a HiNWell implantation, a HiPWell implantation, a P-well implantation, and an N-well implantation.

The heavy implantation processes generate more vacancies and interstitials in the area of the substrate 102 associated with the program transistor 104 and the control capacitor 106. This may lead to faster oxidation rates in these areas during a subsequent oxidation step (such as an oxidation step used to form the front-end gate oxide 134a). As a result, a thicker gate oxide may be formed in this area of the substrate 102, along with normal thickness CMOS gate oxide over other areas of the substrate 102.

The front-end gate oxide 134a formed in this manner may initially have a lower quality. To improve the quality of the front-end gate oxide 134a, a rapid thermal process anneal can be performed after the initial formation of the front-end gate oxide 134a. This may help to reduce defects in the front-end gate oxide 134a and increase its quality without having much impact on the oxide over other areas of the substrate 102.

Although FIG. 1 illustrates one example of a memory cell 100, various changes may be made to FIG. 1. For example, FIG. 1 is not drawn to scale, and various elements in FIG. 1 could have any suitable size or shape.

FIGS. 2A through 2G illustrate an example manufacturing process for manufacturing a memory cell according to one embodiment of this disclosure. In particular, FIGS. 2A through 2G illustrate an example manufacturing process for manufacturing the memory cell 100 of FIG. 1. The manufacturing process illustrated in FIGS. 2A through 2G is for illustration only. Other manufacturing processes could be used to fabricate the memory cell 100 without departing from the scope of this disclosure.

Figure 2A:
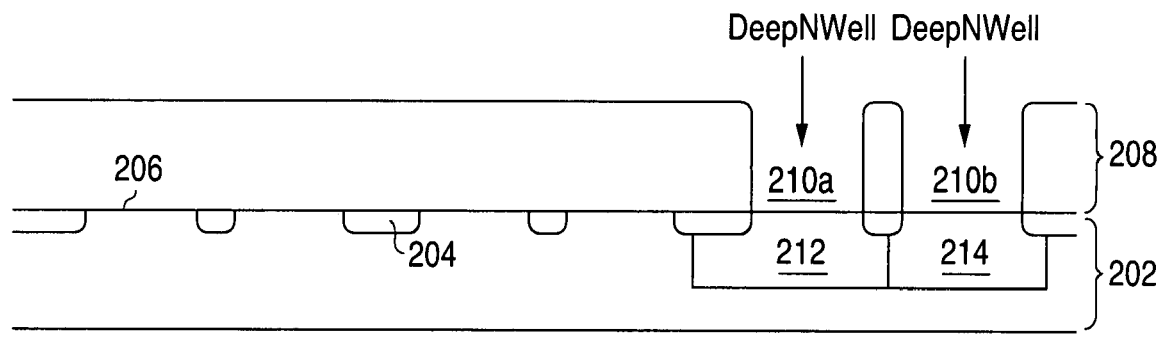
FIGS. 2A through 2G illustrate an example manufacturing process for manufacturing a memory cell according to one embodiment of this disclosure.

As shown in FIG. 2A, a substrate 202 is provided having various trenches 204 formed in the substrate 202. The trenches 204 could be formed in any suitable manner, such as by etching the trenches 204 in the substrate 202 and filling the trenches 204 with one or more liners, a dielectric, or any other or additional material(s). A thin screen oxide layer 206 is formed over the substrate 202, and a resist layer 208 is deposited on the substrate 202. The resist layer 208 represents any suitable material(s) that can be patterned and used to mask the substrate 202.

The resist layer 208 is then patterned to form two openings 210a-210b. The openings 210a-210b are formed over the areas of the substrate 202 associated with the program transistor 104 and the control capacitor 106. Once the openings 210a-210b are formed, a deep N-well implantation occurs, forming two doped regions 212-214 in the substrate 202. At this point, the resist layer 208 can be stripped off of the substrate 202.

Figure 2B:
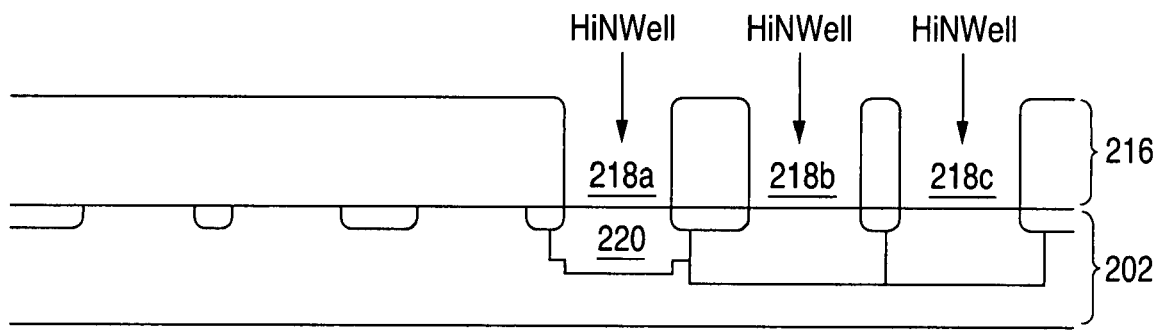

As shown in FIG. 2B, another resist layer 216 is formed over the substrate 202, and three openings 218a-218c are formed in the resist layer 216. These openings 218a-218c are associated with the program transistor 104, the control capacitor 106, and the HiPMOS transistor 118. A HiPWell implantation occurs, forming an additional doped region 220 in the substrate 202. At this point, the resist layer 216 can be stripped off of the substrate 202.

Figure 2C:
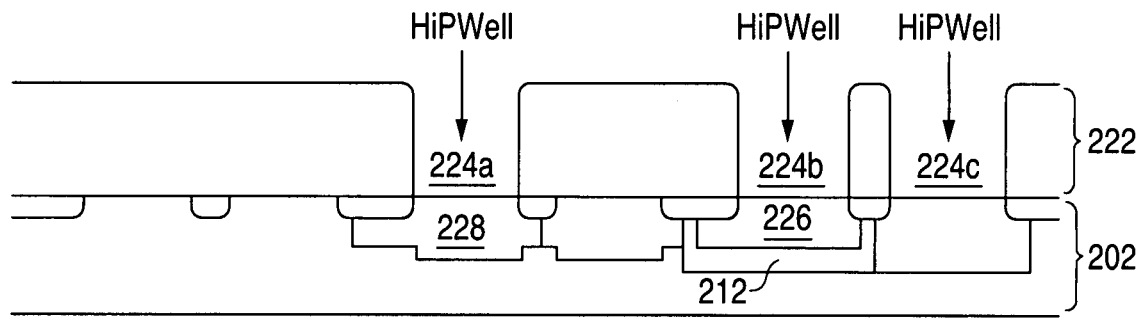

As shown in FIG. 2C, a third resist layer 222 is formed over the substrate 202, and three openings 224a-224c are formed in the resist layer 222. These openings 224a-224c are associated with the program transistor 104, the control capacitor 106, and the HiNMOS transistor 120. A HiPWell implantation occurs, forming a doped region 226 within the doped region 212 and forming a doped region 228 in the substrate 202. The resist layer 222 can then be stripped off of the substrate 202.

Figure 2D:
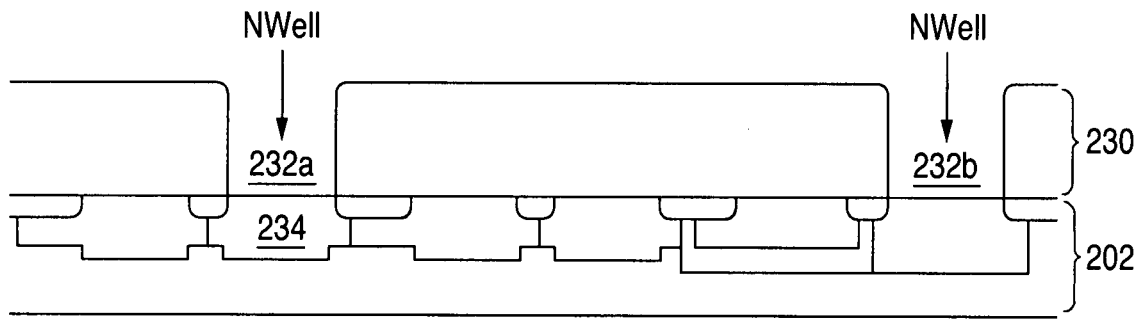

As shown in FIG. 2D, a fourth resist layer 230 is formed over the substrate 202, and two openings 232a-232b are formed in the resist layer 230. These openings 232a-232b are associated with the control capacitor 106 and the PMOS transistor 122. An N-well implantation occurs, forming a doped region 234 in the substrate 202. The resist layer 230 can then be stripped off of the substrate 202.

Figure 2E:
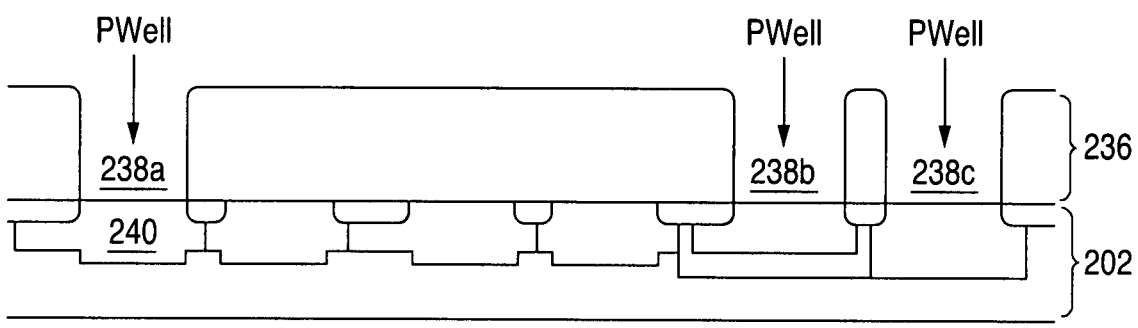

As shown in FIG. 2E, a fifth resist layer 236 is formed over the substrate 202, and three openings 238a-2388c are formed in the resist layer 236. These openings 238a-2388c are associated with the program transistor 104, the control capacitor 106, and the NMOS transistor 124. A P-well implantation occurs, forming a doped region 240 in the substrate 202. The resist layer 236 can then be stripped off of the substrate 202.

Figure 2F:
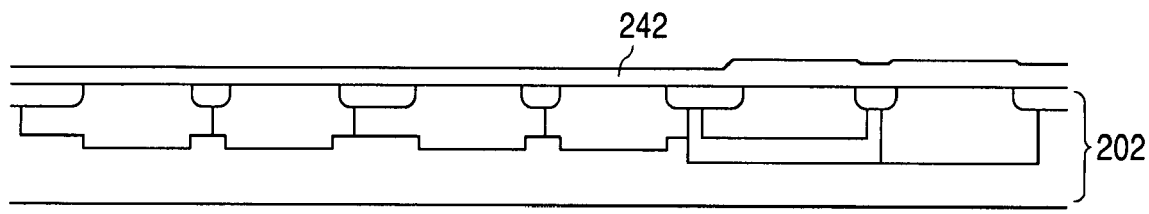

At this point in the manufacturing process, the area of the substrate 202 associated with the program transistor 104 has undergone four different implantations (DNW, HiPWell, HiPWell, and P-well). Similarly, the area of the substrate 202 associated with the control capacitor 106 has undergone five different implantations (DNW, HiPWell, HiNWell, P-well, and N-well). As shown in FIG. 2F, a front-end gate oxide 242 is formed over the substrate 202. This could involve, for example, oxidizing the upper surface of the substrate 202. Because the areas of the substrate 202 associated with the program transistor 104 and the control capacitor 106 have undergone several implantations, the oxidation of the substrate 202 in these areas occurs to a greater extent. As a result, the front-end gate oxide 242 is thicker in these areas of the substrate 202 than in the areas of the substrate 202 associated with the transistors 118-124.

Although not shown in FIG. 2F, a rapid thermal process anneal can be performed after the formation of the front-end gate oxide 242. Because the areas of the substrate 202 associated with the program transistor 104 and the control capacitor 106 have undergone several implantations, the gate oxide produced in these areas may represent a lower quality oxide. The rapid thermal process anneal can help to reduce or eliminate any defects in the front-end gate oxide 242 in these areas without having much impact on other areas of the gate oxide 242.

Figure 2G:
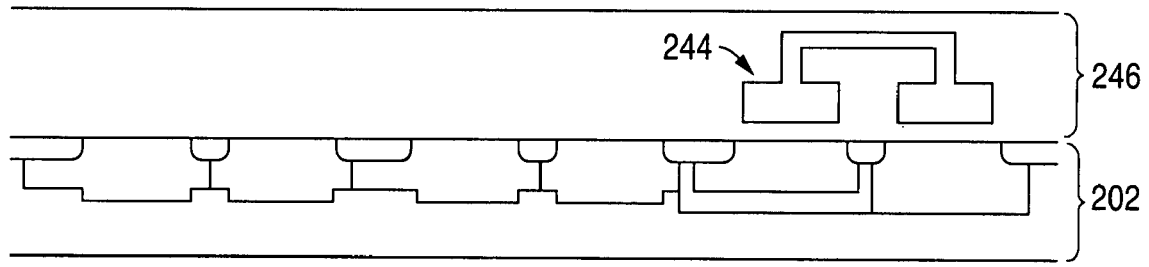

As shown in FIG. 2G, a floating gate 244 can then be fabricated. Also, additional oxide can be deposited to complete an oxide layer 246.

Although FIGS. 2A through 2G illustrate one example of a manufacturing process for manufacturing a memory cell, various changes may be made to FIGS. 2A through 2G. For example, the various implantations (and the corresponding formations and removals of the appropriate resist layers) could occur in any suitable order. As a particular example, the DNW, HiPWell, and HiNWell implantations could occur first and in any order. After that, the P-well and N-well implantations could occur in any order.

Figure 3:
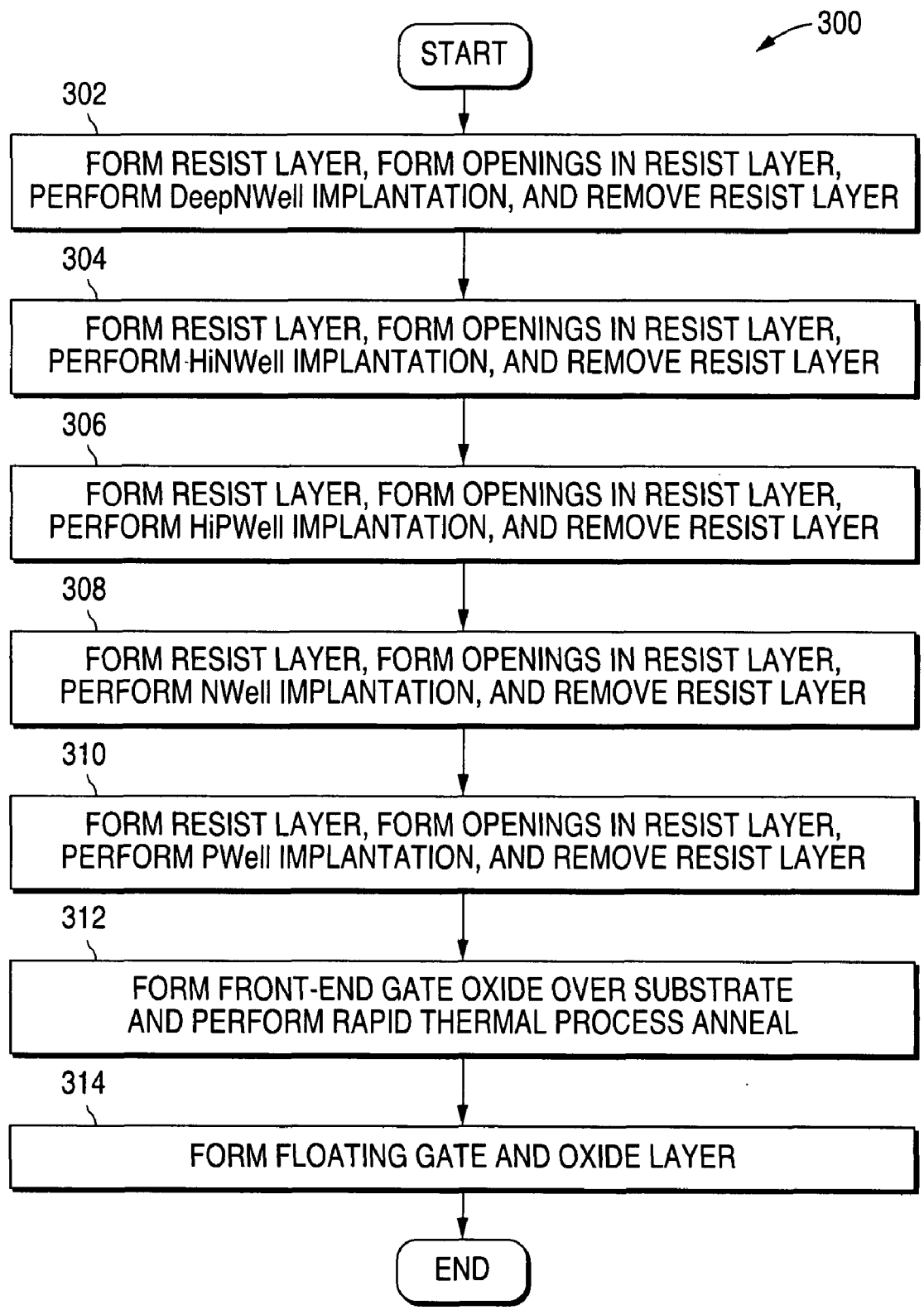
FIG. 3 illustrates an example method for forming a memory cell according to one embodiment of this disclosure.

FIG. 3 illustrates an example method 300 for forming a memory cell according to one embodiment of this disclosure. The embodiment of the method 300 shown in FIG. 3 is for illustration only. Other embodiments of the method 300 could be used without departing from the scope of this disclosure. Also, for ease of explanation, the method 300 is described with respect to the memory cell 100 of FIG. 1. The method 300 could be used with any other suitable memory cell.

A first resist layer is formed over a substrate and patterned to create openings, a deep N-well implantation occurs, and the resist layer is removed at step 302. This could include, for example, performing the deep N-well implantation in the areas of the substrate 102 associated with the program transistor 104 and the control capacitor 106.

A second resist layer is formed over the substrate and patterned to create openings, a HiNWell implantation occurs, and the resist layer is removed at step 304. This could include, for example, performing the HiNWell implantation in the areas of the substrate 102 associated with the program transistor 104, the control capacitor 106, and the HiPMOS transistor 118.

A third resist layer is formed over the substrate and patterned to create openings, a HiPWell implantation occurs, and the resist layer is removed at step 306. This could include, for example, performing the HiPWell implantation in the areas of the substrate 102 associated with the program transistor 104, the control capacitor 106, and the HiNMOS transistor 120.

A fourth resist layer is formed over the substrate and patterned to create openings, an N-well implantation occurs, and the resist layer is removed at step 308. This could include, for example, performing the N-well implantation in the areas of the substrate 102 associated with the control capacitor 106 and the PMOS transistor 122.

A fifth resist layer is formed over the substrate and patterned to create openings, a P-well implantation occurs, and the resist layer is removed at step 310. This could include, for example, performing the P-well implantation in the areas of the substrate 102 associated with the program transistor 104, the control capacitor 106, and the NMOS transistor 124.

A front-end gate oxide is formed over the substrate and a rapid thermal process anneal is performed at step 312. The front-end gate oxide could be formed during an oxidation process, where a portion of the substrate 102 is oxidized. Also, the gate oxide may be thicker over the implants associated with the program transistor 104 and the control capacitor 106 than in other portions of the memory cell 100. The rapid thermal process anneal could represent a short anneal (possibly a few seconds) used to remove defects in the gate oxide.

A floating gate and an oxide layer are then formed at step 314. The floating gate can be formed over the thicker portions of the front-end gate oxide, and the oxide layer could cover the front-end gate oxide and the floating gate.

Although FIG. 3 illustrates one example of a method 300 for forming a memory cell, various changes may be made to FIG. 3. For example, as noted above, the various implantations could occur in a different order than that shown in FIG. 3.

Figure 4:
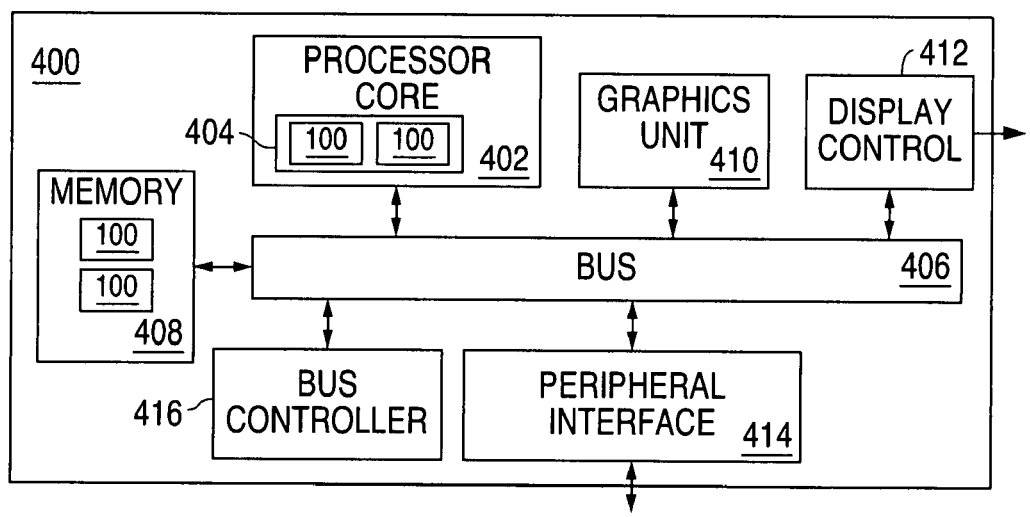
FIG. 4 illustrates an example device incorporating a memory cell according to one embodiment of this disclosure.

FIG. 4 illustrates an example device 400 incorporating a memory cell according to one embodiment of this disclosure. The embodiment of the device 400 shown in FIG. 4 is for illustration only. Other embodiments of the device 400 may be used without departing from the scope of this disclosure.

The device 400 shown in FIG. 4 represents one of numerous possible uses of the memory cell 100 of FIG. 1. In this example, the device 400 represents a "system on a chip," where various components are formed on a single semiconductor wafer.

As shown in FIG. 4, the device 400 includes a processor core 402 having an embedded memory 404. The processor core 402 represents any suitable processing device, such as a microprocessor or microcontroller, capable of executing instructions and providing one or a wide variety of functions. The embedded memory 404 may store instructions and data used, generated, or collected by the processor core 402. The embedded memory 404 may represent volatile and/or non-volatile memory, such as an EEPROM or other memory incorporating a number of memory cells 100.

A bus 406 couples the processor core 402 to other components in the device 400. For example, a memory 408 may store instructions and data used, generated, or collected by the processor core 402. The memory 408 could, for example, represent RAM, ROM, EEPROM, and/or other type(s) of memory. The memory 408 could incorporate a number of memory cells 100. A graphics unit 410 can perform various functions related to rendering or otherwise processing graphics data. A display control 412 facilitates the display of information (such as the rendered graphics) on an external display device (such as an LCD or other monitor). A peripheral interface 414 facilitates communication with one or more external devices. A bus controller 416 facilitates control over and management of the bus 406.

The device 400 is shown here at a general level of detail because it is intended to represent any of a wide variety of electronic devices. For example, the device 400 may represent a printer rendering system for use in a laser printer. The device 400 may also represent a portion of video/audio compression-decompression circuitry in a video camera, digital video recorder (DVR), digital video/versatile disk (DVD) player, cable television set-top box, stereo receiver, or other device. The device 400 could further represent a portion of a mobile device, such as a mobile telephone or personal digital assistant.

Although FIG. 4 illustrates one example of a device 400 incorporating a memory cell 100, various changes may be made to FIG. 4. For example, various components in FIG. 4 could be combined or omitted and additional components could be added according to particular needs. As a particular example, the graphics unit 410 or the display control 412 could be omitted if the device 400 does not require graphics rendering or the use of a display. Also, FIG. 4 is meant to illustrate a single example of the wide variety of devices in which the memory cell 100 could be used. The memory cell 100 of FIG. 1 could be used in any other suitable circuit, device, or system, such as any device requiring the use of non-volatile memory.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. In addition, terms implying a directional relationship (such as "top" and "upper") are used only with respect to the drawings and are not meant to limit the scope of this disclosure.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A method comprising:
performing multiple implantations in a first portion of a substrate and in a second portion of the substrate, the first and second portions associated with a memory cell being fabricated; and
forming an oxide over the first and second portions of the substrate and over a third portion of the substrate, the oxide thicker over the first and second portions of the substrate than over the third portion of the substrate;
wherein performing the multiple implantations comprises performing a deep N-well (DNW) implantation, a high-energy N-well (HiNWell) implantation, a high-energy P-well (HiPWell) implantation, and a P-well implantation; and
wherein the HiNWell implantation is also used to form a high-energy N-well for a high-energy PMOS (HiPMOS) transistor in the third portion of the substrate, the HiPWell implantation is also used to form a high-energy P-well for a high-energy NMOS (HiNMOS) transistor in the third portion of the substrate, and the P-well implantation is also used to form a P-well for an NMOS transistor in the third portion of the substrate.

2. The method of claim 1, wherein:
the first portion of the substrate is associated with a program transistor of the memory cell; and
the second portion of the substrate is associated with a control capacitor of the memory cell.

3. The method of claim 2, further comprising:
forming a floating gate of the memory cell over the first and second portions of the substrate.

4. The method of claim 1, further comprising:
performing a rapid thermal process anneal on the oxide to reduce defects in the oxide.

5. The method of claim 1, wherein performing the multiple implantations further comprises performing at least one additional implantation in the second portion of the substrate that is not performed in the first portion of the substrate.

6. The method of claim 5, wherein performing the at least one additional implantation in the second portion of the substrate comprises performing an N-well implantation, the N-well implantation also used to form an N-well for a PMOS transistor in the third portion of the substrate.

7. The method of claim 1, wherein the first and second portions of the substrate have a higher oxidation rate than the third portion of the substrate where the wells of the HiPMOS transistor, the HiNMOS transistor, and the NMOS transistor are formed, the higher oxidation rate causing the oxide to be thicker over the first and second portions of the substrate than over the third portion of the substrate.

8. The method of claim 6, wherein the DNW implantation, the HiNWell implantation, and the HiPWell implantation occur prior to the P-well implantation and the N-well implantation.

9. A method comprising:
performing multiple implantations to form a first doped region of a substrate and a second doped region of the substrate, the first doped region associated with a program transistor of a memory cell, the second doped region associated with a control capacitor of the memory cell;
forming an oxide over the substrate, the oxide thicker over the first and second doped regions than over multiple third doped regions of the substrate; and
forming a floating gate of the memory cell over the first and second doped regions of the substrate;
wherein performing the multiple implantations comprises performing a deep N-well (DNW) implantation, a high-energy N-well (HiNWell) implantation, a high-energy P-well (HiPWell) implantation, and a P-well implantation; and
wherein the HiNWell implantation is also used to form a high-energy N-well for a high-energy PMOS (HiPMOS) transistor in a first one of the third doped regions of the substrate, the HiPWell implantation is also used to form a high-energy P-well for a high-energy NMOS (HiNMOS) transistor in a second one of the third doped regions of the substrate, and the P-well implantation is also used to form a P-well for an NMOS transistor in a third one of the third doped regions of the substrate.

10. The method of claim 9, further comprising:
performing a rapid thermal process anneal on the oxide to reduce defects in the oxide.

11. The method of claim 9, wherein performing the multiple implantations further comprises performing at least one additional implantation to form the second doped region of the substrate that is not performed to form the first doped region of the substrate.

12. The method of claim 11, wherein performing the at least one additional implantation to form the second doped region of the substrate comprises performing an N-well implantation, the N-well implantation also used to form an N-well for a PMOS transistor in a fourth one of the third doped regions of the substrate.

13. The method of claim 9, wherein the first and second doped regions of the substrate have a higher oxidation rate than the third doped regions of the substrate, the higher oxidation rate causing the oxide to be thicker over the first and second doped regions of the substrate than over the third doped regions of the substrate.

14. A method comprising:
performing multiple implantations in a first portion of a substrate and in a second portion of the substrate, the first portion of the substrate associated with a program transistor of a memory cell, the second portion of the substrate associated with a control capacitor of the memory cell;
forming an oxide over the substrate, the oxide thicker over the first and second portions of the substrate than over a third portion of the substrate; and
forming a floating gate of the memory cell over the first and second portions of the substrate;
wherein performing the multiple implantations comprises (i) performing a deep N-well (DNW) implantation, a high-energy N-well (HiNWell) implantation, a high-energy P-well (HiPWell) implantation, and a P-well implantation in the first portion of the substrate and (ii)

performing the DNW implantation, the HiNWell implantation, the HiPWell implantation, the P-well implantation, and an N-well implantation in the second portion of the substrate; and wherein the HiNWell implantation is also used to form a high-energy N-well for a high-energy PMOS (HiPMOS) transistor in the third portion of the substrate, the HiPWell implantation is also used to form a high-energy P-well for a high-energy NMOS (HiNMOS) transistor in the third portion of the substrate, the P-well implantation is also used to form a P-well for an NMOS transistor in the third portion of the substrate, and the N-well implantation is also used to form an N-well for a PMOS transistor in the third portion of the substrate.

15. The method of claim 14, further comprising:
performing a rapid thermal process anneal on the oxide to reduce defects in the oxide.

16. The method of claim 14, wherein the DNW implantation, the HiNWell implantation, and the HiPWell implantation occur prior to the P-well implantation and the N-well implantation.

17. The method of claim 14, wherein the DNW implantation occurs prior to the HiNWell implantation and the HiPWell implantation.

18. The method of claim 14, wherein the first and second portions of the substrate have a higher oxidation rate than the third portion of the substrate where the wells of the HiPMOS transistor, the HiNMOS transistor, the NMOS transistor, and the PMOS transistor are formed, the higher oxidation rate causing the oxide to be thicker over the first and second portions of the substrate than over the third portion of the substrate.

19. The method of claim 18, wherein the multiple implantations form more vacancies and interstitials in the first and second portions of the substrate than in the third portion of the substrate.

20. The method of claim 14, wherein forming the floating gate of the memory cell comprises:
forming a first portion of the floating gate over the first portion of the substrate;
forming a second portion of the floating gate over the second portion of the substrate; and
electrically coupling the first and second portions of the floating gate.

\* \* \* \* \*